United States Patent
Kim

(10) Patent No.: US 9,040,394 B2
(45) Date of Patent: May 26, 2015

(54) METHOD FOR FABRICATING A SEMICONDUCTOR DEVICE

(71) Applicant: SAMSUNG ELECTRONICS CO., LTD., Suwon-si, Gyeonggi-do (KR)

(72) Inventor: Jin-Bum Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 87 days.

(21) Appl. No.: 13/795,701

(22) Filed: Mar. 12, 2013

(65) Prior Publication Data

US 2014/0273377 A1 Sep. 18, 2014

(51) Int. Cl.
*H01L 21/00* (2006.01)
*H01L 29/16* (2006.01)
*H01L 21/8234* (2006.01)

(52) U.S. Cl.
CPC ........ *H01L 29/16* (2013.01); *H01L 21/823412* (2013.01); *H01L 21/823418* (2013.01)

(58) Field of Classification Search
CPC ..................... H01L 29/7848; H01L 21/02532; H01L 21/0262
See application file for complete search history.

(56) References Cited

U.S. PATENT DOCUMENTS

| | | | |
|---|---|---|---|
| 6,395,621 B1 | 5/2002 | Mizushima et al. | |
| 7,579,617 B2 | 8/2009 | Shimamune et al. | |
| 7,696,537 B2 | 4/2010 | Kohyama | |
| 7,800,182 B2 | 9/2010 | Han et al. | |
| 7,989,296 B2 | 8/2011 | Lee et al. | |
| 8,058,133 B2 | 11/2011 | Tsai et al. | |
| 8,071,442 B2 | 12/2011 | Kronholz et al. | |
| 2008/0176378 A1* | 7/2008 | Batra et al. | 438/427 |
| 2008/0311732 A1* | 12/2008 | Dokumaci et al. | 438/525 |
| 2009/0001479 A1* | 1/2009 | Wiatr et al. | 257/384 |
| 2009/0184341 A1 | 7/2009 | Chong et al. | |
| 2011/0024840 A1* | 2/2011 | Khater | 257/347 |

FOREIGN PATENT DOCUMENTS

| | | |
|---|---|---|
| KR | 1020080087278 | 10/2008 |
| KR | 1020090038158 | 4/2009 |

* cited by examiner

*Primary Examiner* — Zandra Smith
*Assistant Examiner* — Andre' C Stevenson
(74) *Attorney, Agent, or Firm* — F. Chau & Associates, LLC

(57) ABSTRACT

A method for fabricating a semiconductor device includes forming a plurality of gate patterns including a top portion and a bottom portion on a substrate, forming a sacrificial layer contacting the bottom portions of the gate patterns, forming a first spacer on lateral surfaces of the top portions of the gate patterns after forming the sacrificial layer, removing the sacrificial layer after forming the first spacer, and forming a plurality of first recesses on lateral surfaces of the gate patterns after removing the sacrificial layer.

20 Claims, 9 Drawing Sheets

METHOD FOR FABRICATING A SEMICONDUCTOR DEVICE

1. TECHNICAL FIELD

The present disclosure relates to a method for fabricating a semiconductor device.

2. DISCUSSION OF THE RELATED ART

With the development in electronic technology, the downscaling of semiconductor devices has been rapidly progressing. Recently, there has been an increasing demand for faster and more accurate operating semiconductor devices. Accordingly, various studies for optimizing the structure of a transistor included in a semiconductor device have been conducted.

SUMMARY

Exemplary embodiments of the present invention provide a method for fabricating a semiconductor device, which can form a recess having a tip in close proximity of a channel region by forming a sacrificial layer under gate patterns in a recess formation process performed before an embedded source/drain formation process, which is one of strained Si processes.

According to an exemplary embodiment of the present invention, there is provided a method for fabricating a semiconductor device. The method includes forming a plurality of gate patterns including a top portion and a bottom portion on a substrate, forming a sacrificial layer contacting the bottom portions of the gate patterns, forming a first spacer on lateral surfaces of the top portions of the gate patterns after forming the sacrificial layer, removing the sacrificial layer after forming the first spacer, and forming a plurality of first recesses on lateral surfaces of the gate patterns after removing the sacrificial layer.

According to an exemplary embodiment of the present invention, there is provided a method for fabricating a semiconductor device. The method includes forming a plurality of first gate patterns including a top portion and a bottom portion on a first active region of a substrate and a plurality of second gate patterns including a top portion and a bottom portion on a second active region of the substrate, forming a sacrificial layer contacting the bottom portions of the first gate patterns, forming a first spacer on lateral surfaces of the top portions of the first gate patterns after forming the sacrificial layer, removing the sacrificial layer after forming the first spacer, and forming a plurality of first recesses on lateral surfaces of the first gate patterns after removing the sacrificial layer.

According to an exemplary embodiment of the present invention, a method for fabricating a semiconductor device is provided. The method includes sequentially forming an insulation layer, an electrode layer and a hard mask layer on a first active region of a substrate and on a second active region of the substrate, patterning the insulation layer, the electrode layer and the hard mask layer to form a plurality of first gate stacks including a first gate insulation layer, a first gate electrode and a first gate hard mask sequentially stacked on the first active region of the substrate and a plurality of second gate stacks including a second gate insulation layer, a second gate electrode and a second gate hard mask sequentially stacked on the second active region of the substrate, forming a spacer layer covering the first gate stacks including the first gate insulation layer, the first gate electrode and the first gate hard mask and the second gate stacks including the second gate insulation layer, the second gate electrode and the second gate hard mask, etching the spacer layer to form a first spacer on a sidewall of the first gate insulation layer, the first gate electrode and the first gate hard mask of the first gate stacks and a second spacer on a sidewall of the second gate insulation layer, the second gate electrode and the second gate hard mask of the second gate stacks to thereby respectively form a plurality of first gate patterns including a top portion and a bottom portion on the first active region of the substrate and a plurality of second gate patterns including a top portion and a bottom portion on the second active region of the substrate, forming a sacrificial layer contacting the bottom portions of the first gate patterns but not contacting top portions of the first gate patterns, forming a third spacer on lateral surfaces of the top portions of the first gate patterns after forming the sacrificial layer.

In addition, the method further includes removing the sacrificial layer after forming the third spacer, forming a plurality of first recesses on lateral surfaces of the first gate patterns after removing the sacrificial layer, and forming a plurality of second recesses by etching the first recesses and forming a plurality of semiconductor patterns in the second recesses. A portion of the semiconductors patterns are elevated relative to a top surface of the substrate, at an interface between the first gate patterns and the substrate and the semiconductor patterns contact lateral surfaces of the first spacers of the first gate patterns.

BRIEF DESCRIPTION OF THE DRAWINGS

Exemplary embodiments of the present invention can be understood in more detail from the following detailed description taken in conjunction with the attached drawings in which.

DETAILED DESCRIPTION OF EXEMPLARY EMBODIMENTS

Exemplary embodiments of the present invention will now be described more fully hereinafter with reference to the accompanying drawings, in which exemplary embodiments of the invention are shown. Exemplary embodiments of the invention may, however, be embodied in different forms and should not be construed as limited to exemplary embodiments set forth herein. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Hereinafter, a method for fabricating a semiconductor device according to an embodiment of the present invention will be described with reference to FIGS. 1 to 8.

FIGS. 1 to 8 are cross-sectional views illustrating intermediate process steps in a method for fabricating a semiconductor device according to an embodiment of the present invention.

Figure 1:
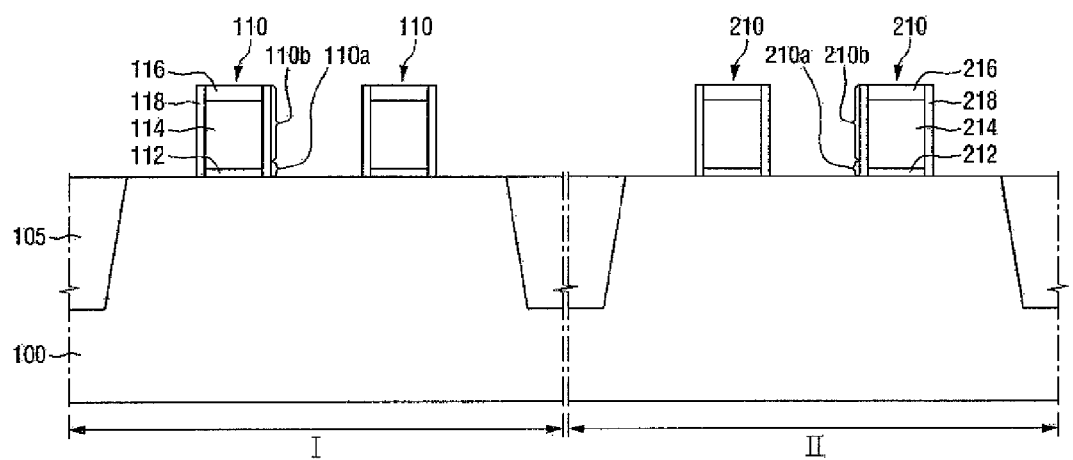
FIGS. 1 to 8 are cross-sectional views illustrating intermediate process steps in a method for fabricating a semiconductor device according to an exemplary embodiment of the present invention.

Referring to FIG. 1, first gate patterns 110 and second gate patterns 210 are formed on a substrate 100 having a first active region I and a second active region II. For example, a plurality of first gate patterns 110 are formed on the first active region I to be spaced apart from each other, and a plurality of second gate patterns 210 are formed on the second active region II to be spaced apart from each other.

In the method for fabricating the semiconductor device according to the present embodiment of the present invention, the first active region I of the substrate 100 may be, for example, a PMOS formation region, and the second active region II of the substrate 100 may be, for example, an NMOS formation region, but exemplary embodiments of the present invention are not limited thereto.

The plurality of first gate patterns 110 formed on the first active region I may include, for example, a first gate insulation layer 112, a first gate electrode 114 and a first spacer 118. The first gate patterns 110 may further include, for example, a first gate hard mask 116. Likewise, the plurality of second gate patterns 210 formed on the second active region II may include, for example, a second gate insulation layer 212, a second gate electrode 214, a second gate hard mask 216 and a second spacer 218. The first gate patterns 110 and the second gate patterns 210 may be formed by, for example, sequentially stacking the gate insulation layers 112 and 212 and the gate electrodes 114 and 214, respectively. The first spacer 118 and the second spacer 218 may be formed, for example, on lateral surfaces of the first gate patterns 110 and the second gate patterns 210, respectively. When the gate hard masks 116 and 216 are formed, the spacers 118 and 218 may be formed, for example, in contact with the gate insulation layers 112 and 212, the gate electrodes 114 and 214 and the gate hard masks 116 and 216, respectively.

The first gate patterns 110 and second gate patterns 210 may be used as gates of field effect transistors, but exemplary embodiments of the present invention are not limited thereto. That is to say, for example, when the first gate patterns 110 and the second gate patterns 210 are dummy gate patterns, insulation layers and/or electrodes of the gate patterns may be formed again in a subsequent process step.

For example, an insulation layer, an electrode layer and a hard mask layer may be sequentially formed on the substrate 100 having the isolation layer 105 formed thereon. A mask pattern may be formed on the hard mask layer to form the first gate patterns 110 and the second gate patterns 210. The first gate stacks including the first gate insulation layer 112, the first gate electrode 114 and the first gate hard mask 116 are formed on the first active region I and the second gate stacks including the second gate insulation layer 212, the second gate electrode 214 and the second gate hard mask 216 are formed on the second active region II using the mask pattern as an etch mask. Thereafter, a spacer layer covering the first gate stacks including the first gate insulation layer 112, the first gate electrode 114 and the first gate hard mask 116 and the second gate stacks including the second gate insulation layer 212, the second gate electrode 214 and the second gate hard mask 216 may be formed on the substrate 100. The spacer layer is, for example, directionally etched, thereby forming the first spacer 118 and the second spacer 218 on sidewalls of the first gate stacks including the first gate insulation layer 112, the first gate electrode 114 and the first gate hard mask 116 and the second gate stacks including the second gate insulation layer 212, the second gate electrode 214 and the second gate hard mask 216, respectively. As such, the first gate patterns 110 are formed on the first active region I, and the second gate patterns 210 are formed on the second active region II. For example, before the etching for forming the first spacer 118 and the second spacer 218, impurities are implanted into both sides of the first gate patterns 110 and the second gate patterns 210, thereby forming source/drain extensions, respectively. According to the types of the first gate patterns 110 and the second gate patterns 210, the implantation impurities may be n type or p type impurities. In addition, halo may be formed, for example, in the source/drain extensions through the impurity implantation.

For example, the substrate 100 may include bulk silicon or a silicon-on-insulator (SOI). Alternatively, the substrate 100 may be, for example, a silicon substrate or may include other materials, such as, for example, silicon germanium, indium antimonide, lead telluride, indium arsenide, indium phosphide, gallium arsenide or gallium antimonide, but not limited thereto.

In the method for fabricating the semiconductor device according to the present exemplary embodiment of the present invention, the substrate 100 will be described with regard to a silicon substrate by way of example. As the isolation layer 105 has a beneficial device isolating characteristic and occupies a small area, it can be formed to have a shallow trench isolation (STI) structure, which is beneficial for achieving high integration, but exemplary embodiments of the present invention are not limited thereto.

The first gate insulation layer 112 and the second gate insulation layer 212 may include, for example, silicon oxide ($SiO_2$), silicon oxynitride (SiON), germanium oxynitride ($Ge_xO_yN_z$), germanium silicon oxide ($Ge_xSi_yO_z$), a high dielectric constant material, or combinations thereof, and may be formed as a stacked layer including these materials sequentially stacked. The high dielectric constant material may include, but are not limited to, at least one selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The first and second gate insulation layers 112 and 212 may be formed by, for example, atomic layer deposition (ALD) or chemical vapor deposition (CVD).

If the first and second gate insulation layers 112 and 212 include high-k dielectrics, a barrier layer may further be formed between each of the first and second gate insulation layers 112 and 212 and each of the first and second gate electrodes 114 and 214. The barrier layer may include, for example, at least one selected from the group consisting of titanium nitride (TiN), tantalum nitride (TaN) and a combination thereof.

The first gate electrode 114 and the second gate electrode 214 may include, but are not limited to, polycrystalline silicon (poly-Si) or amorphous silicon (a-Si). That is to say, the first and second gate electrodes 114 and 214 may be metal electrodes including metallic materials. The first and second gate electrodes 114 and 214 may be formed by, for example, sputtering, CVD, or plasma deposition, but exemplary embodiments of the present invention are not limited thereto.

The first gate hard mask 116 and the second gate hard mask 216 may include, for example, a nitride film, an oxide film, or a combination thereof. The first and second gate hard masks 116 and 216 may be formed by, for example, CVD.

The first spacer 118 and the second spacer 218 may include, for example, may include, silicon nitride (SiN), silicon oxynitride (SiON), silicon oxide ($SiO_2$), or silicon oxycarbide (SiOCN). The first and second spacers 118 and 218 may be formed by, for example, CVD. While each of the first and second spacers 118 and 218 are formed as a single layer in the present embodiment, exemplary embodiments of the present invention are not limited thereto. That is to say, each of the first and second spacers 118 and 218 may have, for example, a multi-layered structure.

In the method for fabricating the semiconductor device according to the present embodiment of the present invention, each of the first gate patterns 110 formed on the first active region I includes, for example, a bottom portion 110a and a top portion 110b, and each of the second gate patterns 210 formed on the second active region II includes, for example, a bottom portion 210a and a top portion 210b. The top and bottom portions of each of the first gate patterns 110 and the second gate patterns 210 are defined in view of the sacrificial layer 10 shown in FIG. 2. That is to say, a portion of each gate pattern contacting the sacrificial layer 10 is referred to as a bottom portion, and a portion of the gate pattern not contacting the sacrificial layer 10 is referred to as a top portion.

Figure 2:
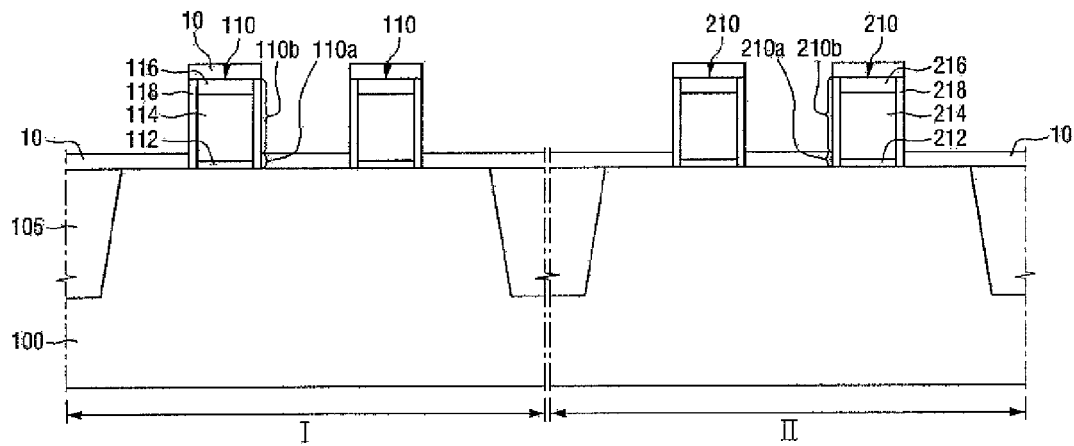

Referring to FIG. 2, the sacrificial layer 10 is formed, for example, in contact with the bottom portions 110a of the first gate patterns 110 on the first active region I but not in contact with the top portions 110b of the first gate patterns 110. In addition, the sacrificial layer 10 may be formed, for example, in contact with the bottom portions 210a of the second gate patterns 210 on the second active region II but not in contact with the top portions 210b of the second gate patterns 210. In addition, the sacrificial layer 10 may further be formed, for example, on top surfaces of the first gate patterns 110 and the second gate patterns 210. In other words, the sacrificial layer 10 is formed on the top surfaces of the first gate patterns 110 and on the top surfaces of the second gate patterns 210 but is not formed on lateral surfaces of the top portions 110b of the first gate patterns 110 and lateral surfaces of the top portions 210b of the second gate patterns 210.

The sacrificial layer 10 may be formed by, for example, directional deposition. The directional deposition may be achieved by at least one of, for example, an ion implantation process (IIP) using a cluster ion source and a deposition process using a plasma source with directionality given by bias application, but exemplary embodiments of the present invention are not limited thereto. That is to say, if only the directionality was demonstrated when a layer is deposited, any type of directional deposition can be employed. Thus, the deposition process using a plasma source and a bias can be adequately employed to achieve the directional deposition for forming the sacrificial layer 10.

As the sacrificial layer 10 is formed by the directional deposition having directionality, it is formed in contact with the bottom portions 110a of the first gate patterns 110 and the bottom portions 210a of the second gate patterns 210 and on top surfaces of the first and second gate patterns 110 and 210. In addition, as the sacrificial layer 10 is formed by the directional deposition having directionality, it may not be formed on lateral surfaces of the top portions 110b of the first gate patterns 110 and lateral surfaces of the top portions 210b of the second gate patterns 210.

The sacrificial layer 10 may include, for example, at least one of silicon oxide, silicon nitride and silicon oxynitride, but is not limited thereto. As the sacrificial layer 10 is removed in a subsequent process step, it may have etching selectivity with respect to the first spacer 118. For example, when the first spacer 118 is made of silicon nitride, the sacrificial layer 10 may include silicon oxide.

Figure 3:
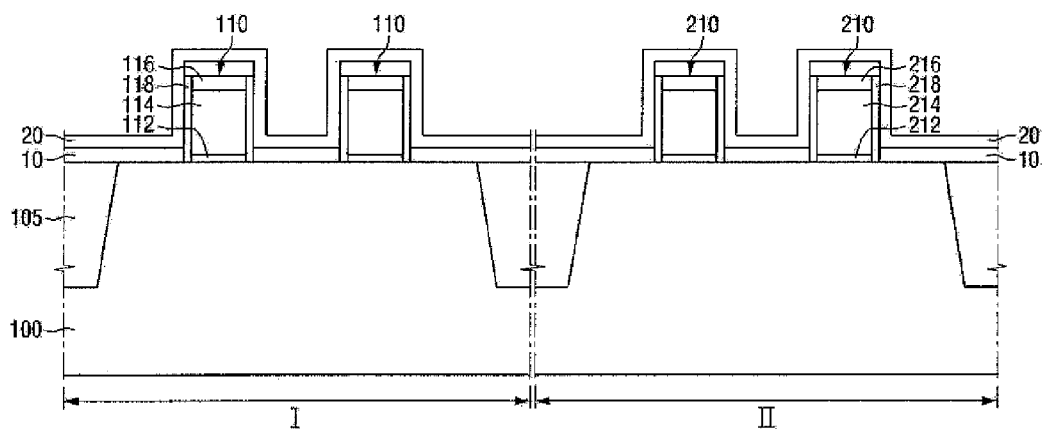

Referring to FIG. 3, a spacer layer 20 is formed on the substrate 100 having a first active region I and a second active region II. For example, the spacer layer 20 covers the first gate patterns 110, the second gate patterns 210 and the sacrificial layer 10. Unlike the sacrificial layer 10, the spacer layer 20 is formed along the profile of the first gate patterns 110, the second gate patterns 210 and the sacrificial layer 10 formed on the substrate 100.

The spacer layer 20 may include, for example, at least one of silicon oxide, silicon nitride and silicon oxynitride, but is not limited thereto. The spacer layer 20 may be formed by, for example, CVD.

Figure 4:
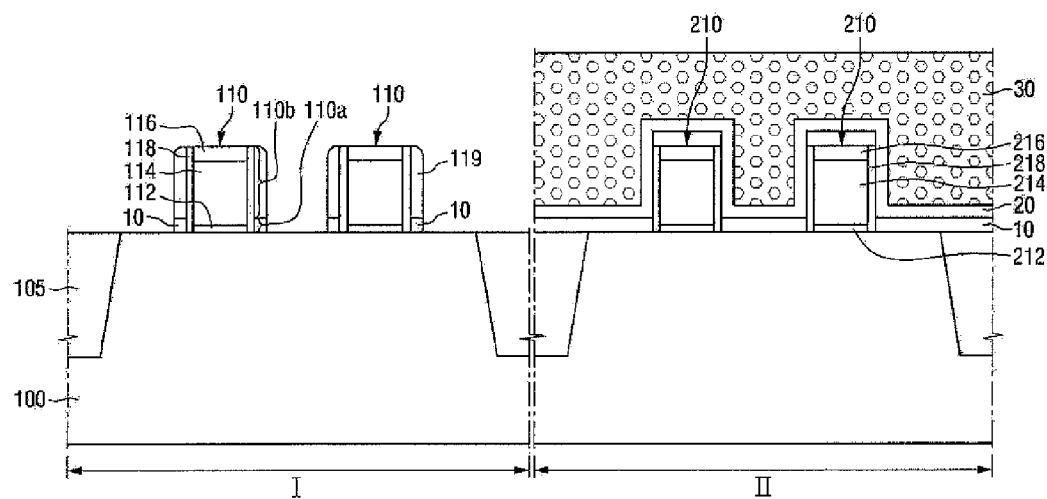

Referring to FIG. 4, a blocking pattern 30 is formed on the second active region II. The blocking pattern 30 may be used as, for example, an etch mask in a subsequent process to etch the spacer layer 20 and the sacrificial layer 10 formed on the first active region I. The spacer layer 20 and the sacrificial layer 10 formed on the first active region I are etched, thereby forming a third spacer 119 on lateral surfaces of top portions 110b of the first gate patterns 110 and the sacrificial layer 10 on lateral surfaces of bottom portions 110a of the first gate patterns 110.

For example, a blocking layer is formed on the substrate 100 having the spacer layer 20. The blocking layer may be, for example, a photoresist layer, but exemplary embodiments of the present invention are not limited thereto. The blocking layer formed on the first active region I is removed by, for example, exposure, thereby forming the blocking pattern 30 on the second active region II.

Thereafter, the sacrificial layer 10 and the spacer layer 20 formed on the first active region I are etched using, for example, the blocking pattern 30 as an etch mask to be removed. The sacrificial layer 10 and the spacer layer 20 formed on the first active region I may be etched until the substrate 100 on the first active region I is exposed. That is to say, the sacrificial layer 10 and the spacer layer 20 formed on the first active region I are etched to expose the substrate 100. The etching of the sacrificial layer 10 and the spacer layer 20 formed on the first active region I may include, for example, directional etching.

When the sacrificial layer 10 and the spacer layer 20 formed on the first active region I are etched by directional etching, the third spacer 119 derived from the spacer layer 20 is formed on the lateral surfaces of the top portions 110b of the first gate patterns 110. In addition, as a portion of the sacrificial layer 10 where the third spacer 119 serves as an etch mask is not etched, the portion of the sacrificial layer 10 remains without being removed.

That is to say, the third spacer 119 is formed on the lateral surfaces of the top portions 110b of the first gate patterns 110, and the sacrificial layer 10 is formed on the lateral surfaces of the bottom portions 110a of the first gate patterns 110. A first spacer 118 may be formed, for example, on lateral surfaces of first gate stacks including the first gate insulation layer 112, the first gate electrode 114 and the first gate hard mask 116. The sacrificial layer 10 and the third spacer 119 may be, for example, sequentially stacked on the lateral surfaces of the first gate patterns 110 including the first spacer 118. The sacrificial layer 10 and the third spacer 119 formed on the lateral surfaces of the first gate patterns 110 are formed at the same level. Here, the expression "the same level" is used to mean that the sacrificial layer 10 and the third spacer 119 are formed through the same fabrication process.

At this process step, separation of the sacrificial layer 10 formed on the first active region I is performed. That is to say, while the sacrificial layers 10 are formed in contact with the bottom portions 110a of the first gate patterns 110, they are not connected to each other. However, the sacrificial layers 10 formed on the second active region II protected by the blocking pattern 30 are formed to connect neighboring second gate patterns 210 to each other.

The sacrificial layers 10 formed in contact with the bottom portions 110a of the first gate patterns 110 are removed in a subsequent process step, while leaving the first spacer 118 and the third spacer 119 without being removed. That is to say, as it may be necessary to selectively remove only the sacrificial layers 10, the first spacer 118 and the third spacer 119 should be made of materials having etching selectivity with respect to the sacrificial layers 10. When the first spacer 118 and the third spacer 119 are made of, for example, silicon nitride, the sacrificial layer 10 may include, for example, silicon oxide having etching selectivity with respect to silicon nitride, but exemplary embodiments of the present invention are not limited thereto.

Figure 5:
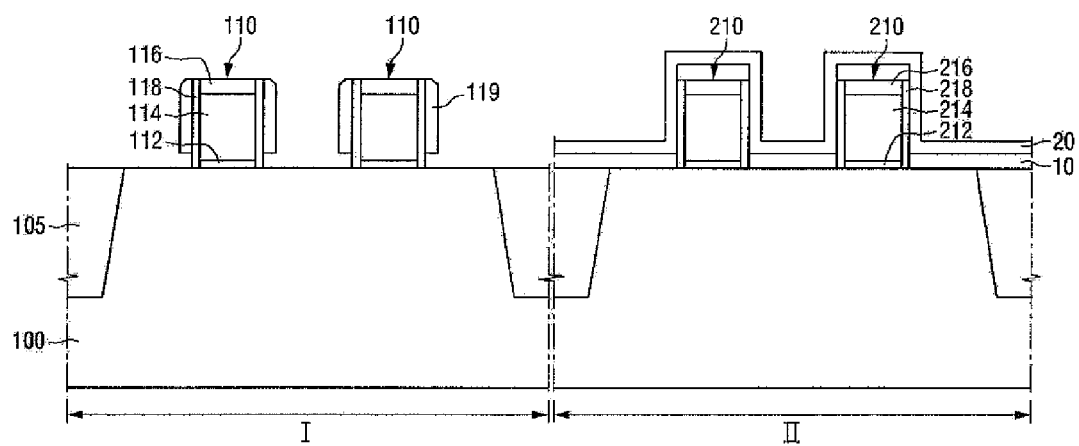

Referring to FIG. 5, the blocking pattern 30 formed on the second active region II is removed, and the sacrificial layers 10 formed under the third spacer 119 on the first active region I are removed. That is to say, the sacrificial layers 10 formed in contact with the bottom portions 110a of the first gate patterns 110 and positioned under the third spacer 119 are removed. The sacrificial layers 10 may be removed by, for example, wet etching, but exemplary embodiments of the present invention are not limited thereto.

For example, the blocking pattern 30 covering the second active region II is removed to expose the spacer layers 20 formed on the second active region II.

After exposing the spacer layer 20, an etching step for removing the sacrificial layers 10 is performed. Even if the sacrificial layers 10 are wet etched for removal, only the sacrificial layers 10 formed on the first active region I are removed because the spacer layer 20 having etching selectivity with respect to the sacrificial layers 10 is formed on the sacrificial layers 10 formed on the second active region II.

That is to say, in the sacrificial layers 10 formed in the process step shown in FIG. 2, the sacrificial layers formed on the first active region I are removed, but the sacrificial layers formed on the second active region II are not removed because they are protected by the spacer layer 20.

As the sacrificial layers 10 are removed from the first active region I, a space is created between the substrate 100 and the third spacer 119 formed on the lateral surfaces of the first gate patterns 110 (e.g., the lateral surfaces of the top portions 110b of the first gate patterns 110). A height of the space between the third spacer 119 and the substrate 100 is, for example, equal to a thickness of the sacrificial layer 10 removed, that is, a thickness of the sacrificial layer 10 deposited in the process step shown in FIG. 2.

As the sacrificial layers 10 have been removed from the first active region I, there is no layer contacting the bottom portions 110a of the first gate patterns 110, that is, the lateral surfaces of the bottom portions 110a of the first gate patterns 110. As the result, a portion of the first spacer 118 is exposed. In other words, as the result of removing the sacrificial layers 10, a bottom portion of the first spacer 118 is exposed while the third spacer 119 still remains on the lateral surfaces of a top portion of the first spacer 118.

Figure 6:
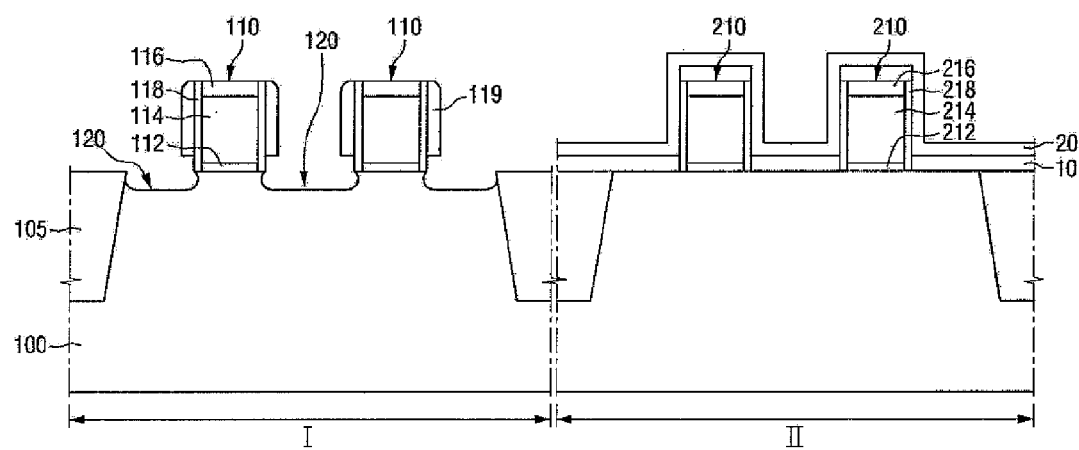

Referring to FIG. 6, first recesses 120 are formed on the lateral surfaces of the first gate patterns 110 on the first active region I. In other words, the first recesses 120 are formed between, for example, a plurality of first gate patterns 110 and between the first gate pattern 110 and an isolation layer 105.

For example, the substrate 100 exposed between the plurality of first gate patterns 110 is etched, thereby forming the first recesses 120. In addition, the substrate 100 exposed between the first gate patterns 110 and the isolation layer 105 is etched, thereby forming the first recesses 120. The first recesses 120 on the first active region I may be formed by etching, for example, dry etching or wet etching. For example, the first recesses 120 may be formed by isotropically dry etching, but exemplary embodiments of the present invention are not limited thereto.

At least portions of the third spacer 119 formed on the lateral surfaces of the first gate patterns 110 may overlap the first recesses 120. In the method for fabricating the semiconductor device according to the present embodiment of the present invention, the third spacer 119, for example, entirely overlaps the first recesses 120, but exemplary embodiments of the present invention are not limited thereto.

For example, when the first recesses 120 are formed by isotropically dry etching or wet etching, the substrate 100 positioned directly under the exposed third spacer 119 may also be etched at the removing of the sacrificial layers 10 shown in FIG. 5. In the method for fabricating the semiconductor device according to the present embodiment of the present invention, the substrate 100 positioned directly under the third spacer 119 exposed by removing the sacrificial layers 10 from the first active region I is, for example, entirely etched to form the first recesses 120, but exemplary embodiments of the present invention are not limited thereto.

A width of a topmost portion of the first recess 120 may be, for example, substantially the same as a distance between first spacers 118 formed on two neighboring first gate patterns 110 and facing each other, but exemplary embodiments of the present invention are not limited thereto. In other words, the first recesses 120 may be, for example, recessed into the substrate 100, starting from a point at which a line extending from a contact surface of the first spacer 118 and the third spacer 119 meets the substrate 100. However, the width of the topmost portion of the first recess 120 may be adjusted by adjusting the space between the third spacer 119 and the substrate 100.

Hereinafter, effects obtained by forming the first recesses 120 after removing the sacrificial layer 10 formed in contact with the bottom portions 110a of the first gate patterns 110 will be described. If the third spacer 119 is formed to extend to the substrate 100 without a space between the third spacer 119 and the substrate 100, the width of the topmost portion of the first recess 120 will be substantially the same as a width of two neighboring third spacers 119. However, as the first recess 120 is formed after removing the sacrificial layers 10 formed under the third spacers 119, it may be formed in closer proximity of channel regions of the first gate patterns 110. Accordingly, a tip of a recess to be formed in a subsequent process step becomes closer to the channel regions of the first gate patterns 110, thereby increasing the performance of the semiconductor device.

Figure 7:
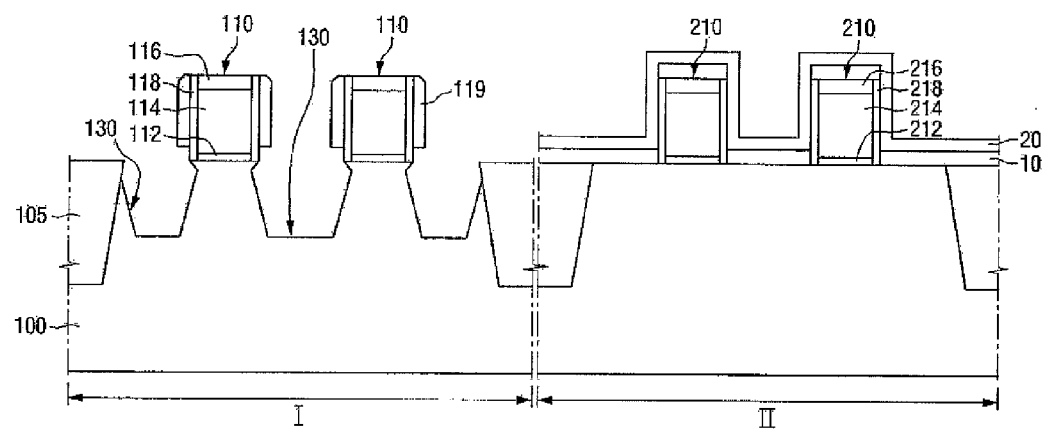

Referring to FIG. 7, second recesses 130 may be formed by, for example, etching the first recesses 120 formed on the lateral surfaces of the first gate patterns 110. The second recesses 130 may be formed by, for example, wet etching. For example, ammonium hydroxide (NH$_4$OH), etc. may be used in the wet etching, but exemplary embodiments of the present invention are not limited thereto.

The first recesses 120 are wet etched, thereby forming the second recesses 130 between the first gate patterns 110 and between the first gate pattern 110 and an isolation layer 105, respectively.

The second recesses 130 formed by wet etching of the first recesses 120 expose a crystalline plane of the substrate 100, such as for example, a crystalline plane of a silicon (Si) substrate.

In the method for fabricating the semiconductor device according to the present exemplary embodiment of the present invention, the second recess 130 may have, for example, a sigma-shaped section.

Figure 8:
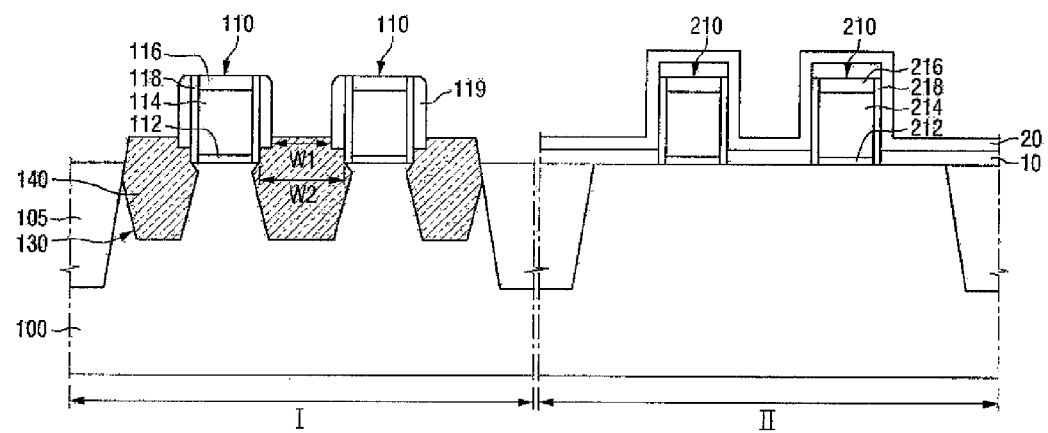

Referring to FIG. 8, semiconductor patterns 140 are formed, for example, in the second recesses 130. The semiconductor patterns 140 may be, for example, elevated relative to a top surface of the substrate 100, that is, an interface between the first gate patterns 110 and the substrate 100, but exemplary embodiments of the present invention are not limited thereto.

The semiconductor patterns 140 elevated relative to the top surface of the substrate 100, that is, the interface between the first gate patterns 110 and the substrate 100 may also make contact with portions of lateral surfaces of the first spacer 118 as well as the lateral surfaces of the third spacer 119. This is because the sacrificial layer 10 positioned between the third spacer 119 and the substrate 100 has been removed, as described above. As the result, the semiconductor patterns 140 may concurrently make contact with the first spacer 118 and the third spacer 119.

In other words, the semiconductor patterns 140 elevated relative to the top surface of the substrate 100 may have, for example, first parts and second parts. The first parts may be, for example, portions of the semiconductor patterns 140 contacting the lateral surfaces of the third spacer 119 and the second parts may be, for example, portions of the semiconductor patterns 140 contacting the lateral surfaces of the first spacer 118. A width between the first parts of the semiconductor patterns 140 may be w1, and a width between the second parts of the semiconductor patterns 140 may be w2. For example, here w1 may be smaller than w2.

In the method for fabricating the semiconductor device according to the present exemplary embodiment of the present invention, the semiconductor patterns 140 elevated from the substrate 100 may have, for example, widths decreasing away from the substrate 100, that is, from w2 to w1.

The semiconductor patterns 140 elevated from the substrate 100 are formed, for example, stepwise in the present embodiment shown in FIG. 8, but exemplary embodiments of the present invention are not limited thereto.

For example, tensional or compressive stress may be applied to channel regions of the first gate patterns 110 due to the semiconductor patterns 140, thereby increasing the performance of the semiconductor device. The semiconductor patterns 140 may be, for example, a source/drain of a transistor formed on the first active region I. The semiconductor patterns 140 may be formed through, for example, epitaxial growth of a semiconductor material into the second recesses 130. That is to say, the semiconductor patterns 140 may be, for example, single crystalline epitaxial layers. The semiconductor patterns 140 may be formed by, for example, CVD or ALD. To apply tensional or compressive stress to channel regions of the first gate patterns 110, the semiconductor patterns 140 may be made of, for example, a material having a different lattice constant from the substrate 100, but exemplary embodiments of the present invention are not limited thereto.

When a semiconductor device is a p type MOS (PMOS) transistor, it is driven by holes. Thus, it may be desirable to apply compressive stress to the substrate 100. The semiconductor patterns 140 may be made of, for example, a material having a larger lattice constant than the substrate 100. That is to say, in a case of a silicon (Si) substrate, the semiconductor patterns 140 may be made of, for example, silicon germanium (SiGe) having a larger lattice constant than Si.

When a semiconductor device is an n type MOS (NMOS) transistor, it is driven by electrons. Thus, it may be desirable to apply tensional stress to the substrate 100. The semiconductor patterns 140 may be made of, for example, a material having a smaller lattice constant than the substrate 100. That is to say, in a case of a Si substrate, the semiconductor patterns 140 may be made of, for example, silicon carbide (SiC) having a smaller lattice constant than Si. However, when a semiconductor device is an NMOS transistor, the semiconductor patterns 140 may form an elevated silicon epitaxial layer.

In the method for fabricating the semiconductor device according to the present exemplary embodiment of the present invention, the semiconductor patterns 140 are formed, for example, in contact with the lateral surfaces of the third spacer 119 as well as the lateral surfaces of the first spacer 118, but exemplary embodiments of the present invention are not limited thereto. That is to say, the semiconductor patterns 140 may be formed to be, for example, in contact with only the lateral surfaces of the first spacer 118 but not in contact with the lateral surfaces of the third spacer 119.

Hereinafter, a method for fabricating a semiconductor device according to an embodiment of the present invention will be described with reference to FIGS. 1 to 3 and 9 to 13. The present embodiment is substantially the same as the previous method described in connection with FIGS. 1 to 8, except that a sacrificial layer between gate patterns is not removed. Thus, like numbers refer to like elements throughout, and repeated descriptions will be briefly given or will not be given.

FIGS. 9 to 13 are cross-sectional views illustrating intermediate process steps in a method for fabricating a semiconductor device according to a embodiment of the present invention.

Figure 9:
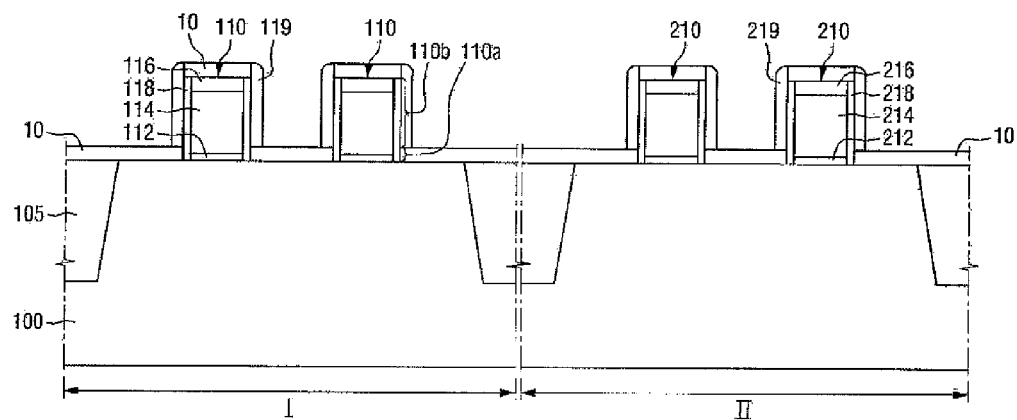
FIGS. 9 to 13 are cross-sectional views illustrating intermediate process steps in a method for fabricating a semiconductor device according to an exemplary embodiment of the present invention.

Referring to FIG. 9, a spacer layer 20 formed on a first active region I and a second active region H is, for example, etched to expose a sacrificial layer 10. That is to say, the spacer layer 20 may be etched until a top surface of the sacrificial layer 10 is exposed. As a result, a third spacer 119 is formed on lateral surfaces of top portions 110b of first gate patterns 110. A spacer may also be formed on lateral surfaces of top portions of second gate patterns 210 formed on the second active region II. The etching of the spacer layer 20 may be, for example, directional etching.

The third spacer 119 formed on the lateral surfaces of top portions 110b of first gate patterns 110 may also be formed on lateral surfaces of the sacrificial layer 10 previously formed on the first gate patterns 110.

Unlike in the previous method shown in FIG. 4, in the present embodiment, after forming the third spacer 119, the first gate patterns 110 and the second gate patterns 210 respectively formed on the first active region I and the second active region II are connected to each other by the sacrificial layer 10.

Figure 10:
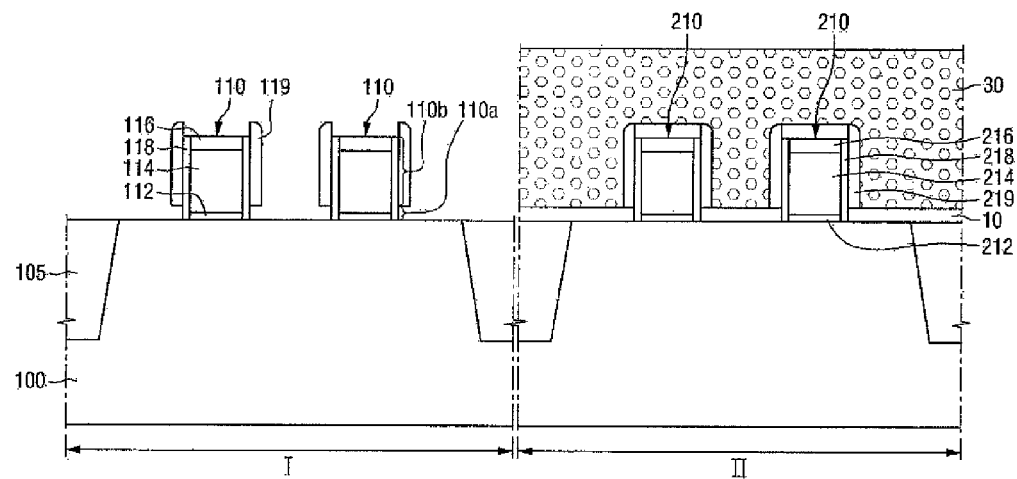

Referring to FIG. 10, a blocking pattern 30 is formed on the second active region II, and the sacrificial layer 10 formed on the first active region I is removed using, for example, the blocking pattern 30 as an etch mask. That is to say, when the sacrificial layer 10 in the first active region I is removed, the sacrificial layer 10 formed in contact with bottom portions 110a of the first gate patterns 110 and connecting two neighboring first gate patterns 110 is removed.

When the sacrificial layer 10 positioned under the third spacer 119 formed on the lateral surfaces of the first gate patterns 110 is removed, the sacrificial layer 10 formed on top surfaces of the first gate patterns 110 is also removed. The sacrificial layer 10 may be removed by, for example, wet etching, but exemplary embodiments of the present invention are not limited thereto.

For example, a blocking layer is formed on the substrate 100 having the third spacer 119 and the exposed sacrificial layer 10. The blocking layer may be, for example, a photoresist layer, but exemplary embodiments of the present invention are not limited thereto. The blocking layer on the first active region I is removed by exposure, thereby forming the blocking pattern 30 on the second active region II.

Thereafter, the sacrificial layer 10 formed on the first active region I is etched using, for example, the blocking pattern 30 as an etch mask to then be removed. As the second active region II is covered by the blocking pattern 30, only the sacrificial layer 10 positioned on the first active region I is removed. As the sacrificial layer 1 positioned on the first active region I is removed, a space is created between the substrate 100 and the third spacer 119 formed on the lateral surfaces of top portions 110b of the first gate patterns 110. As the result, portions of the first spacer 118, such as for example, bottom portions of the first spacer 118, are exposed.

In FIG. 10, as the result of removing the sacrificial layer 10 formed on the first gate patterns 110, the third spacer 119, for example, protrudes higher than the top surface of the first gate pattern 110, which is, however, provided only for illustration, but exemplary embodiments of the present invention are not limited thereto.

Figure 11:
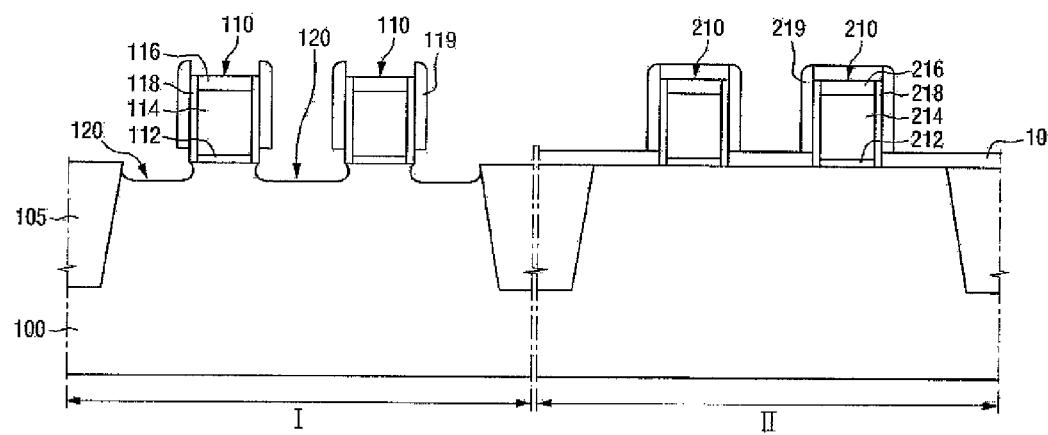

Referring to FIG. 11, the blocking pattern 30 formed on the second active region II is removed, thereby forming first recesses 120 on lateral surfaces of the first gate patterns 110.

For example, the sacrificial layer 10 formed on the second active region II is exposed by removing the blocking pattern 30 covering the second active region II.

After removing the blocking pattern 30, the exposed substrate 100 on the lateral surfaces of the first gate patterns 110 is etched, thereby forming the first recesses 120. The first recesses 120 may be formed by etching, for example, dry etching or wet etching. For example, the first recesses 120 may be formed by isotropically dry etching, but exemplary embodiments of the present invention are not limited thereto.

For example, when the first recesses 120 are formed by isotropically dry etching or wet etching, the substrate 100 positioned directly under the exposed third spacer 119 may also be etched at the removing of the sacrificial layers 10 shown in FIG. 10. In the method for fabricating the semiconductor device according to the present embodiment of the present invention, the substrate 100 positioned directly under the third spacer 119 exposed by removing the sacrificial layers 10 from the first active region I is, for example, entirely etched to form the first recesses 120, but exemplary embodiments of the present invention are not limited thereto.

As the result, the third spacer 119 formed on the lateral surfaces of the first gate patterns 110 may, for example, entirely overlap the first recesses 120.

Figure 12:
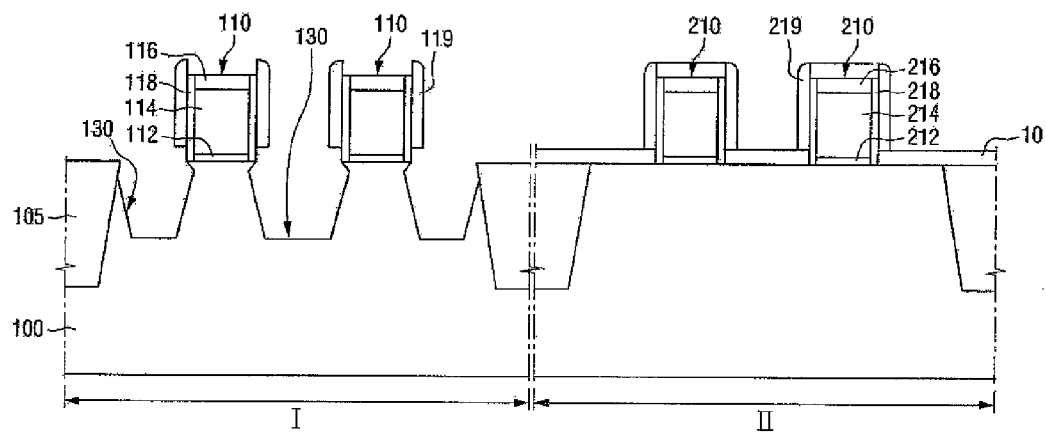

Referring to FIG. 12, the first recesses 120 formed on the lateral surfaces of the first gate patterns 110 are etched, thereby forming second recesses 130. The second recesses 130 may be formed by, for example, wet etching.

The first recesses 120 are wet etched, thereby forming the second recesses 130 between the first gate patterns 110 and between the first gate pattern 110 and an isolation layer 105.

Figure 13:
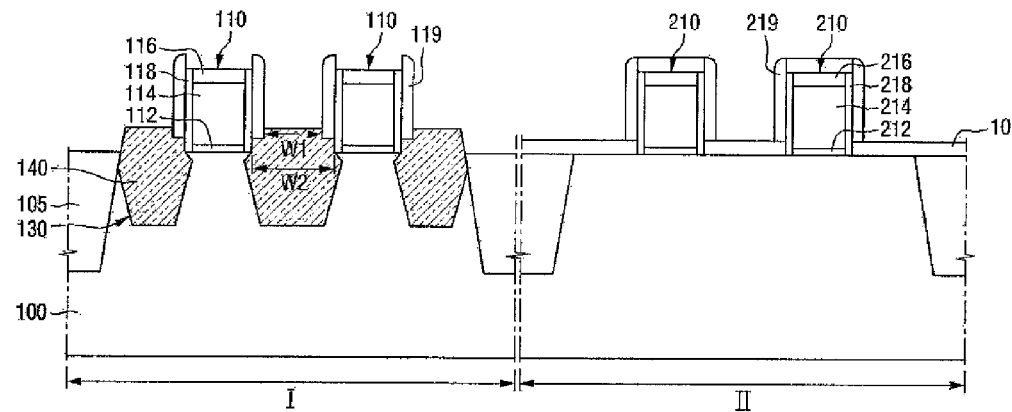

Referring to FIG. 13, semiconductor patterns 140 are formed, for example, in the second recesses 130. The semiconductor patterns 140 may be, for example, elevated relative to a top surface of the substrate 100, that is, an interface between the first gate patterns 110 and the substrate 100.

The semiconductor patterns 140 may be, for example, a source/drain of a transistor formed on the first active region I. The semiconductor patterns 140 may be, for example, single crystalline epitaxial layers. To apply tensional or compressive stress to channel regions of the first gate patterns 110, the semiconductor patterns 140 may be made of, for example, a material having a different lattice constant from the substrate 100.

Figure 14:
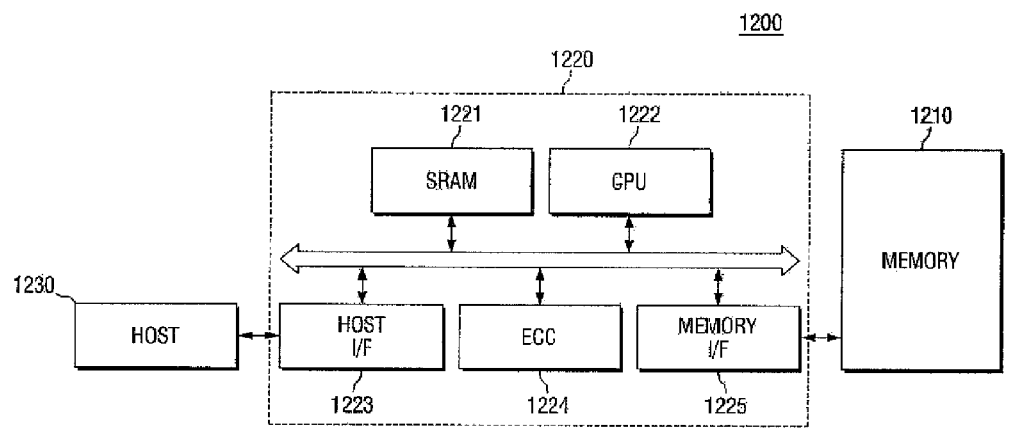
FIG. 14 is a block diagram of a memory card including a semiconductor device according to an exemplary embodiment of the present invention.

FIG. 14 is a block diagram of a memory card including a semiconductor device according to an embodiment of the present invention.

Referring to FIG. 14, the memory 1210 including, for example, the semiconductor device according to an embodiment of the present invention may be employed to a memory card 1200. The memory card 1200 may include, for example, a memory controller 1220 controlling data exchange between a host 1230 and the memory 1210. An SRAM 1221 may be used as an operating memory of a central processing unit (CPU) 1222. A host interface (I/F) 1223 may include, for example, a protocol for exchanging data by allowing the host 1230 to be connected to the memory card 1200. An error correction code (ECC) 1224 may be used to detect and correct an error of data read from the memory 1210. A memory interface (I/F) 1225 may interface with the memory 1210. The central processing unit (CPU) 1222 may perform the overall control operation associated with the data exchange of the memory controller 1220.

Figure 15:
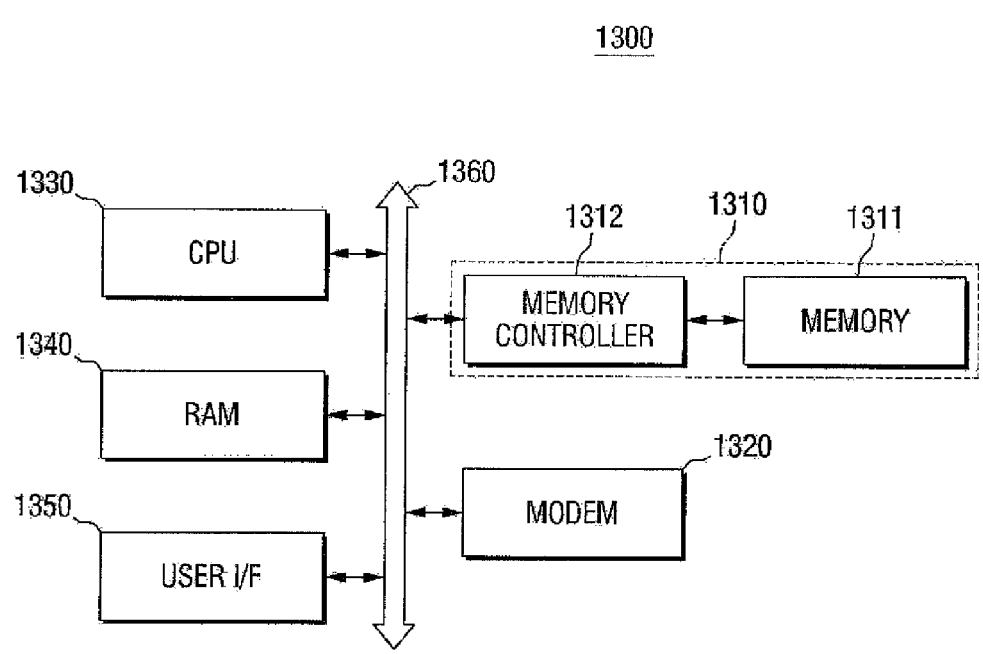
FIG. 15 is a block diagram of an information processing system using a semiconductor device according to an exemplary embodiment of the present invention.

FIG. 15 is a block diagram of an information processing system using a semiconductor device according to an embodiment of the present invention.

Referring to FIG. 15, the information processing system 1300 may include, for example, a memory system 1310 including a semiconductor device according to embodiments of the present invention. The information processing system 1300 may include, for example, a memory system 1310, a modem 1320, a central processing unit (CPU) 1330, a RAM 1340 and a user interface (I/F) 1350, which are electrically connected to a system bus 1360. The memory system 1310 may include, for example, a memory 1311 and a memory controller 1312 and may have substantially the same configuration as that of the memory card 1200 shown in FIG. 14. The data processed by the central processing unit (CPU) 1330 or the data received from an external device may be stored in the memory system 1310. The information processing system 1300 may be applied to, for example, a memory card, a solid state disk (SSD), a camera image sensor and other various chip sets. For example, the memory system 1310 may employ an SSD. In this case, the information processing system 1300 can process a large amount of data in a stable, reliable manner.

Figure 16:
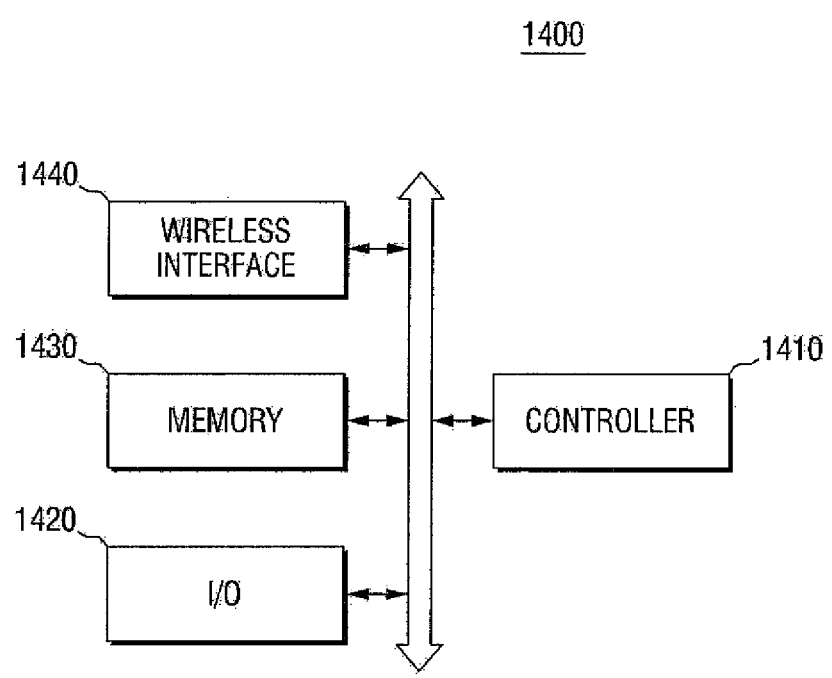
FIG. 16 is a block diagram of an electronic system including a semiconductor device according to an exemplary embodiment of the present invention.

FIG. 16 is a block diagram of an electronic system including a semiconductor device according to an embodiment of the present invention.

Referring to FIG. 16, the electronic system 1400 may be applied to, for example, a personal digital assistant (PDA), a portable computer, a web tablet, a wireless phone, a mobile phone, a digital music player, a memory card, or any type of electronic device capable of transmitting and/or receiving information in a wireless environment.

The electronic system 1400 may include, for example, a controller 1410, an input/output device (I/O) 1420, a memory 1430, and a wireless interface 1440. Here, the memory 1430 may include, for example, various semiconductor devices according to an embodiment of the present invention. The controller 1410 may include, for example, at least one of a microprocessor, a digital signal processor, and the like. The memory 1430 may store data and/or commands (or user data) processed by the controller 1410. The wireless interface 1440 may be used to transmit data to a wireless data network or receive data from the communication network. The wireless interface 1440 may include, for example, an antenna or a wireless transceiver. The electronic system 1400 may use, for example, a third generation communication system protocol, such as code division multiple access (CDMA) communication system, global system for mobile communication (GSM), North American dual mode cellular (NADC), Evolutionary-TDMA Scheduling Protocol (E-TDMA), wideband code division multiple access (WCDMA), or code division multiple access 2000 (CDMA2000).

Having described the exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method for fabricating a semiconductor device, the method comprising:
    forming a plurality of gate patterns including a top portion and a bottom portion on a substrate;
    forming a sacrificial layer contacting the bottom portions of the gate patterns;
    forming a first spacer on lateral surfaces of the top portions of the gate patterns after forming the sacrificial layer;
    removing the sacrificial layer from under the first spacer after forming the first spacer; and
    forming a plurality of first recesses at the side of the gate patterns after removing the sacrificial layer.

2. The method of claim 1, wherein the first spacer entirely overlaps the first recesses.

3. The method of claim 1, wherein the forming of the sacrificial layer comprises: forming the sacrificial layer using directional deposition.

4. The method of claim 3, wherein the forming of the sacrificial layer comprises: forming the sacrificial layer using at least one of an ion implantation process (IIP) using a cluster ion source and a deposition process using a plasma source with directionality given by bias application.

5. The method of claim 1, wherein the forming of the gate patterns comprises:
    forming a gate stack on the substrate and forming a second spacer on lateral surfaces of the gate stack, and the removing of the sacrificial layer comprises: exposing a portion of the second spacer.

6. The method of claim 1, further comprising:
    forming a plurality of second recesses by etching the first recesses; and
    forming a plurality of semiconductor patterns in the second recesses.

7. A method for fabricating a semiconductor device, the method comprising:
    forming a plurality of gate patterns including a top portion and a bottom portion on a substrate;
    forming a sacrificial layer contacting the bottom portions of the gate patterns;
    forming a first spacer on lateral surfaces of the top portions of the gate patterns after forming the sacrificial layer;
    removing the sacrificial layer after forming the first spacer; and
    forming a plurality of first recesses at the side of the gate patterns after removing the sacrificial layer,
    wherein the forming of the first spacer comprises: forming the sacrificial layer contacting the bottom portions of the gate patterns while not contacting the lateral surfaces of the top portions of the gate patterns, forming a spacer layer covering the sacrificial layer and the gate patterns on the substrate, and exposing the sacrificial layer by etching the spacer layer.

8. The method of claim 7, wherein the forming of the first spacer further comprises: exposing a top surface of the substrate by removing the exposed sacrificial layer.

9. A method for fabricating a semiconductor device, the method comprising:
    forming a plurality of first gate patterns including a top portion and a bottom portion on a first active region of a substrate and a plurality of second gate patterns including a top portion and a bottom portion on a second active region of the substrate;
    forming a sacrificial layer contacting the bottom portions of the first gate patterns;
    forming a first spacer on lateral surfaces of the top portions of the first gate patterns after forming the sacrificial layer;
    removing the sacrificial layer from under the first spacer after forming the first spacer; and
    forming a plurality of first recesses at the side of the first gate patterns after removing the sacrificial layer.

10. The method of claim 9, wherein the first spacer entirely overlaps the first recesses.

11. A method for fabricating a semiconductor device, the method comprising:
    forming a plurality of first gate patterns including a top portion and a bottom portion on a first active region of a substrate and a plurality of second gate patterns including a top portion and a bottom portion on a second active region of the substrate;
    forming a sacrificial layer contacting the bottom portions of the first gate patterns;
    forming a first spacer on lateral surfaces of the top portions of the first gate patterns after forming the sacrificial layer;
    removing the sacrificial layer after forming the first spacer; and
    forming a plurality of first recesses at the side of the first gate patterns after removing the sacrificial layer,
    wherein the forming of the first spacer comprises: forming the sacrificial layer contacting the bottom portions of the first gate patterns while not contacting the lateral surfaces of the top portions of the first gate patterns, and forming a spacer layer covering the sacrificial layer and the first and second gate patterns on the substrate.

12. The method of claim 11, wherein the sacrificial layer contacts the bottom portions of the second gate patterns while not contacting the top portions of the second gate patterns.

13. The method of claim 12, wherein the forming of the first spacer comprises: forming a blocking pattern on the second active region after the forming of the spacer layer, and exposing the substrate by etching the spacer layer and the sacrificial layer on the first active region.

14. The method of claim 12, wherein the forming of the first spacer comprises: exposing the first active region and the sacrificial layer on the second active region by etching the spacer layer, and forming a blocking pattern on the second active region after exposing the sacrificial layer.

15. The method of claim 9, wherein the forming of the sacrificial layer comprises: forming the sacrificial layer using directional deposition.

16. A method for fabricating a semiconductor device, the method comprising:

sequentially forming an insulation layer, an electrode layer and a hard mask layer on a first active region of a substrate and on a second active region of the substrate;

patterning the insulation layer, the electrode layer and the hard mask layer to form a plurality of first gate stacks including a first gate insulation layer, a first gate electrode and a first gate hard mask sequentially stacked on the first active region of the substrate and a plurality of second gate stacks including a second gate insulation layer, a second gate electrode and a second gate hard mask sequentially stacked on the second active region of the substrate;

forming a spacer layer covering the first gate stacks including the first gate insulation layer, the first gate electrode and the first gate hard mask and the second gate stacks including the second gate insulation layer, the second gate electrode and the second gate hard mask;

etching the spacer layer to form a first spacer on a sidewall of the first gate insulation layer, the first gate electrode and the first gate hard mask of the first gate stacks and a second spacer on a sidewall of the second gate insulation layer, the second gate electrode and the second gate hard mask of the second gate stacks to thereby respectively form a plurality of first gate patterns including a top portion and a bottom portion on the first active region of the substrate and a plurality of second gate patterns including a top portion and a bottom portion on the second active region of the substrate;

forming a sacrificial layer contacting the bottom portions of the first gate patterns but not contacting lateral surfaces of the top portions of the first gate patterns;

forming a third spacer on the lateral surfaces of the top portions of the first gate patterns after forming the sacrificial layer;

removing the sacrificial layer after forming the third spacer;

forming a plurality of first recesses at the side of the first gate patterns after removing the sacrificial layer;

forming a plurality of second recesses by etching the first recesses; and forming a plurality of semiconductor patterns in the second recesses, wherein a portion of the semiconductors patterns are elevated relative to a top surface of the substrate, at an interface between the first gate patterns and the substrate and wherein the semiconductor patterns contact lateral surfaces of the first spacers of the first gate patterns.

17. The method of claim 16, wherein the semiconductor patterns include a first part contacting lateral surfaces of the third spacers and a second part contacting the lateral surfaces of the first spacers of the first gate patterns and wherein a width between the first parts of the semiconductor patterns is less than a width between second parts of the semiconductor patterns.

18. The method of claim 16, wherein the semiconductor patterns are formed through epiaxial growth of a material into the second recesses, wherein the material of the semiconductor patterns has a lattice constant different from a lattice constant of the substrate and wherein the semiconductor patterns have a sigma-shaped section.

19. The method of claim 18, wherein the substrate is a silicon substrate and wherein the semiconductor patterns are made of silicon germanium (SiGe) having a lattice constant which is larger than a lattice constant of silicon.

20. The method of claim 18, wherein the substrate is a silicon substrate and wherein the semiconductor patterns are made of silicon carbide (SiC) having a lattice constant which is smaller than a lattice constant of silicon.

\* \* \* \* \*